United States Patent
Naumann (10) Patent No.: US 10,031,156 B2
(45) Date of Patent: Jul. 24, 2018

(54) THREE-AXIS MICROELECTROMECHANICAL SYSTEMS DEVICES

(71) Applicant: Freescale Semiconductor, Inc., Austin, TX (US)

(72) Inventor: Michael Naumann, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 608 days.

(21) Appl. No.: 14/493,890

(22) Filed: Sep. 23, 2014

(65) Prior Publication Data

US 2016/0084872 A1     Mar. 24, 2016

(51) Int. Cl.
*G01P 15/125* (2006.01)
*B81B 3/00* (2006.01)
*G01P 15/18* (2013.01)
*G01P 15/08* (2006.01)

(52) U.S. Cl.
CPC .......... *G01P 15/125* (2013.01); *B81B 3/0051* (2013.01); *G01P 15/18* (2013.01); *B81B 2201/0235* (2013.01); *B81B 2203/0163* (2013.01); *B81B 2203/051* (2013.01); *B81B 2203/058* (2013.01); *G01P 2015/0814* (2013.01); *G01P 2015/0831* (2013.01)

(58) Field of Classification Search
CPC .......... G01P 15/125; G01P 15/02; B81B 7/02; B81B 2201/0235
USPC ...................................................... 73/514.32
See application file for complete search history.

(56) References Cited

U.S. PATENT DOCUMENTS

| | | | |
|---|---|---|---|
| 2008/0100899 A1* | 5/2008 | Shimokawa | ............ B81B 3/004 359/225.1 |
| 2014/0083190 A1* | 3/2014 | Kaack | ................... G01P 15/125 73/514.14 |
| 2014/0090468 A1* | 4/2014 | Fu | ......................... G01P 15/125 73/504.08 |

FOREIGN PATENT DOCUMENTS

WO     2013116356 A1     8/2013

OTHER PUBLICATIONS

"Triaxial ±2g/±10g Accelerometer SMB360," Bosch (16 pages).
"LIS3L02AQ Inertial Sensor: 3Axis—2g/6g Linear Accelerometer," STMicroelectronics, Nov. 2004 (9 pages).
"SMB380 Triaxial acceleration sensor," Bosch Sensortec, Sep. 18, 2007 (52 pages).
"Small, Low Power, 3-Axis ±3g iMems Accelerometer ADXL330," Analog Devices, Inc., 2007 (16 pages).
(Continued)

*Primary Examiner* — Walter L Linday, Jr.
*Assistant Examiner* — Philip Marcus T Fadul (57) ABSTRACT

The embodiments described herein provide microelectromechanical systems (MEMS) devices, such as three-axis MEMS devices that can sense acceleration in three orthogonal axes (e.g., x-axis, y-axis, and z-axis). In general, the embodiments described can provide decoupling between the sense motions of all three axes from each other. This decoupling is facilitated by the use of an inner frame, and an outer frame, and the use of rotative spring elements combined with translatory spring elements that have asymmetric stiffness. Specifically, the translatory spring elements facilitate translatory motion in two directions (e.g., the x-direction and y-direction) and have an asymmetric stiffness configured to compensate for an asymmetric mass used to sense in the third direction (e.g., the z-direction).

20 Claims, 6 Drawing Sheets

(56) References Cited

OTHER PUBLICATIONS

"LIS331DL MEMS motion sensor 3-axis—±2g/±8g smart digital output "nano" accelerometer," STMicroelectronics, Apr. 2008 (42 pages).
Hongwei Qu et al., "A Monolithic CMOS-MEMS 3-Axis Accelerometer With a Low-Noise, Low-Power Dual-Chopper Amplifier," IEEE Sensors Journal, vol. 8, No. 9, Sep. 2008 (8 pages).
"LIS331DLH MEMS digital output motion sensor ultra low-power high performance 3-axes "nano" accelerometer," STMicroelectronics, Jul. 2009 (38 pages).
"LSM333D iNEMO Intertial Module: 9 degrees of freedon sensing solution," STMicroelectronics, Mar. 2012 (75 pages).
"Micropower, 3-Axis, ±2 g/±4 g/±8g Digital Output MEMS Accelerometer ADXL362," Analog Devices, Inc. 2012-2014 (43 pages).
"MPU-6500 Product Specification: Revision 1.1," InvenSense Inc., Mar. 5, 2014 (40 pages).

\* cited by examiner

THREE-AXIS MICROELECTROMECHANICAL SYSTEMS DEVICES

TECHNICAL FIELD

The present invention relates generally to microelectromechanical systems (MEMS) devices. More specifically, the present invention relates to MEMS devices such as three-axis accelerometers.

BACKGROUND

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One example of a MEMS sensor is a MEMS accelerometer. MEMS accelerometers are sensitive to acceleration or acceleration forces. These forces may be static, like the constant force of gravity, or they can be dynamic, caused by moving or vibrating the sensor. Accelerometers may sense acceleration forces along one, two, or three axes or directions. From this information, the movement or orientation of the device in which the accelerometer is installed can be ascertained.

Commonly, MEMS accelerometers react to acceleration with a change in electrical capacitance, which causes the output of an energized circuit, connected to the sensor, to vary. One common form of MEMS accelerometer uses one or more movable structures that move under acceleration above a substrate. The movement of the movable structure changes capacitance, and the electrical circuit connected to the MEMS accelerometer structure measures the change in capacitance to determine the acceleration forces. Such MEMS accelerometers are widely used in a variety of sensing applications. For example, vehicle or automotive applications may use MEMS accelerometers to determine when to deploy the vehicle airbag or activate a stability and/or traction control system. In addition, consumer electronics devices, such as video game controllers, personal media players, cell phones, and digital cameras, also use MEMS accelerometers in various applications to detect the orientation and/or respond to movement of the device.

Traditionally, in order to sense motion along multiple axes, accelerometers have been provided that include multiple sense masses that move independently of one another in response to accelerations. As these devices continue to shrink in size, it becomes desirable to reduce the collective size of these sense masses. But reducing the collective size of the sense masses can make it increasingly difficult to provide desired sensitivity and reliability. In addition, due to smaller sizes and travel distances of the sense masses, some MEMS accelerometers are vulnerable to high impact loads.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The various embodiments described herein can provide microelectromechanical systems (MEMS) devices with improved reliability or sensitivity in the small form factors desired for present applications. These MEMS devices can include transducers such as MEMS accelerometers, and in particular three-axis MEMS devices that can sense acceleration in three directions (e.g., x-direction, y-direction, z-direction) defined by three axes (e.g., x-axis, y-axis, and z-axis). In general, the embodiments described herein can provide relatively small device size by facilitating the sharing of a sense mass for sensing in all three directions. Furthermore, the embodiments described herein can provide this relatively small device size while still providing relatively good sensitivity. This sensitivity can be provided by decoupling the sense motions of all three axes from each other, and without requiring the use of separate large sense masses for motion in each axial direction. In general, this decoupling means that a sensing displacement in the MEMS device caused by acceleration in one direction does not also cause an unwanted displacement corresponding to another direction. For example, acceleration in a MEMS device in a z-direction will cause a displacement relative to electrodes used to sense acceleration in the z-direction but will not cause significant displacement relative to electrodes used to sense in the x or y-directions. In contrast, in devices without decoupled sense motions, accelerations occurring in one direction can also cause unwanted twisting or rotation, resulting in other displacements relative to the electrodes for other directions, and potentially causing false indications of accelerations in those other directions.

In the embodiments described herein, decoupling is facilitated by the use of translatory spring elements that have asymmetric stiffness. Specifically, the translatory spring elements facilitate translatory motion in two directions (e.g., the x-direction and y-direction) and have an asymmetric stiffness configured to compensate for an asymmetric mass used to sense in the third direction (e.g., the z-direction).

In general, MEMS devices sense a change in, for example, electrical capacitance, with respect to acceleration or other force. One form of MEMS device uses a sensing transducer with movable elements, where the movable elements move under acceleration above a reference substrate. The movement of the frame changes capacitance, and the MEMS accelerometer structure measures the change in capacitance to determine the acceleration forces.

Figure 1:
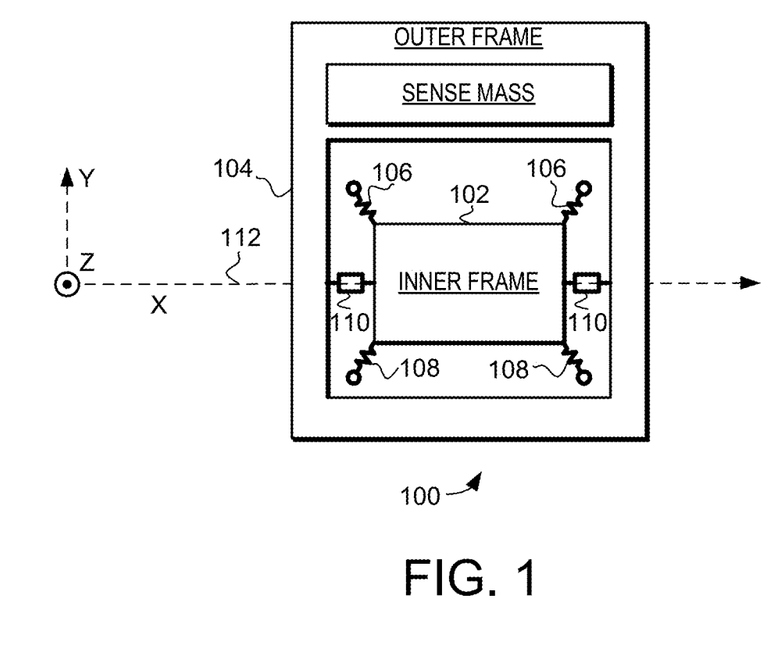
FIG. 1 is a top view of a MEMS device in accordance with an example embodiment.

Turning now to FIG. 1, a schematic view of MEMS device 100 in accordance with example embodiments is illustrated. The MEMS device 100 includes an inner frame 102, an outer frame 104, first translatory spring elements 106, second translatory spring elements 108, and rotative spring elements 110. The inner frame 102 is movably coupled to a substrate (not shown in FIG. 1) through the translatory spring elements 106 and 108. The translatory spring elements 106 and 108 facilitate translatory motion of the inner frame 102 (e.g., motion in the x-direction and a y-direction). This translatory motion of the inner frame is used to detect acceleration in the corresponding directions (e.g., acceleration in the x-direction and y-direction).

The outer frame 104 is rotatively coupled to the inner frame 102 through rotative spring elements 110. This rotative coupling facilitates rotation of the outer frame 104 about a rotational axis 112, but does not allow significant translatory motion of the outer frame 104 relative to the inner frame 102. The outer frame has an asymmetric mass relative to the rotation axis. The asymmetric mass and rotation about the rotational axis provides the sense mass to detect acceleration in a third direction (e.g., in the z-direction) orthogonal to the rotation axis. Importantly, this rotation of the outer frame 104 about the rotation axis 112 can occur without causing the inner frame 102 to rotate as well. Thus, the inner frame 102 is decoupled from the outer frame 104 by the rotative spring elements 110 with regard to accelerations in the third direction.

In one embodiment, the first translatory spring elements 106 each have a first stiffness, and the second translatory spring elements 108 each have a second stiffness. The first stiffness of each first translatory spring element 106 is greater than the second stiffness of the corresponding second translatory spring element 108 to compensate for moments created by the asymmetric mass of the outer frame 104. Specifically, the stiffness difference can compensate for moments caused by translatory acceleration in a first direction defined by a first axis, where the first direction and first axis are orthogonal to the asymmetry. In this illustrated example, acceleration in the first direction corresponds to acceleration in the x-direction. Thus, the compensation provided by the stiffness difference can facilitate accurate determination of acceleration in the x-direction, without that determination being distorted by asymmetric mass of the outer frame 104.

Furthermore, using different stiffness compensate for the asymmetric mass of the outer frame 104 facilitates displacements of the inner frame 102 and outer frame 104 of the correct magnitudes and directions in response to accelerations. That is, the displacements of the inner frame 102 and outer frame 104 can result in little or no unwanted twisting or rotation. Because the inner frame 102 and outer frame 104 correctly displace in response to accelerations in the various directions there is a decoupling and reduction the cross talk between the sensing of accelerations in the multiple directions even while using the same mass features (i.e., the sense mass of the outer frame 104) for sensing these accelerations in all three directions. This reduction of cross talk can improve the sensitivity of the MEMS device 100, while the shared use of the sense mass can provide relatively small device size. Furthermore, in some embodiments this decoupling can facilitate the use flexible travel stops, which can improve reliability of the MEMS device 100.

The translatory spring elements 106 and 108 can be implemented with a variety of different MEMS structures. As one example, the translatory spring elements 106 and 108 can be implemented with bending beam spring elements. For example, the translatory spring elements 106 can be implemented with a MEMS bending beam formed coplanar with the inner frame 102. Such spring elements can be fabricated by a variety of MEMS fabrication techniques.

The outer frame 104 is typically implemented with a first mass (including the sense mass) and the inner frame 102 with a second mass, where the first mass substantially larger than the second mass. In some embodiments it can be desirable for the mass of the inner frame 102 to be minimized to the extent possible while still providing sufficient mechanical stability in the inner frame 102. Thus, in a typical embodiment the first mass will be at least twice the second mass, and more typically the first mass will be at least 10 times the second mass.

Figure 2A:
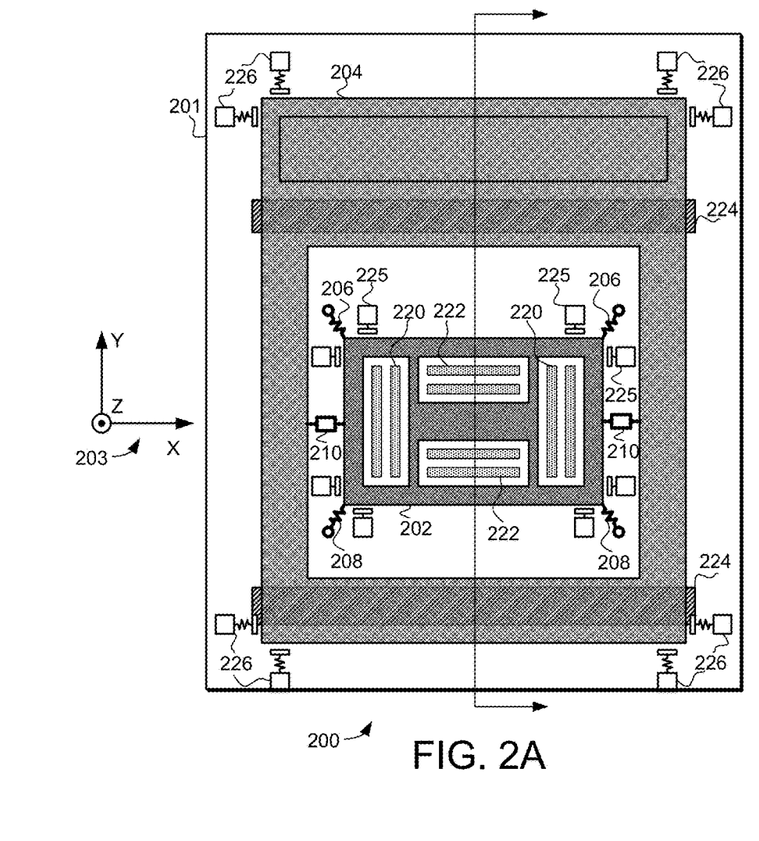
FIGS. 2A-2B are top and cross-sectional side views of a MEMS device in accordance with example embodiments.
Figure 2B:
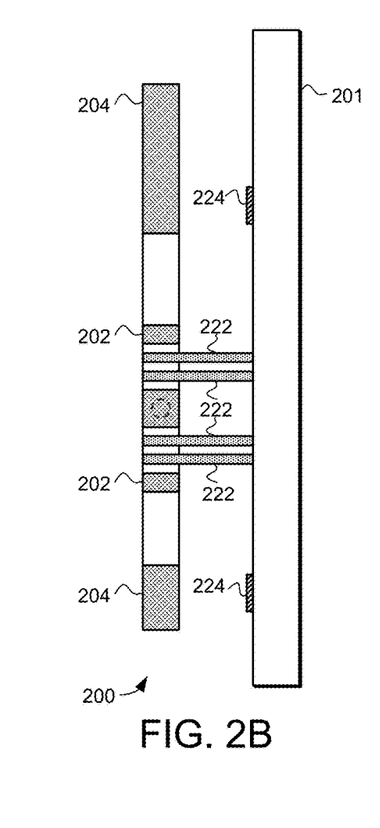

Turning now to FIGS. 2A and 2B, a top view and cross-sectional side view of a MEMS device 200 is illustrated. The MEMS device 200 includes a substrate 201, an inner frame 202, an outer frame 204, first translatory spring elements 206, second translatory spring elements 208, rotative spring elements 210, first electrodes 220, second electrodes 222, third electrodes 224, rigid stops 225, and flexible stops 226. The MEMS device 200 is configured to determine force applied by acceleration in any of three directions. As such, the MEMS device 200 can be referred to as a three-axis accelerometer. In the example of MEMS device 200, those three directions can be described with respect to three orthogonal directions (i.e., x-direction, y-direction, and z-direction as defined by the corresponding axes in coordinate labels 203).

The substrate 201 may be any material or structure which the inner frame 202 and the outer frame 204 be coupled to, such as silicon (e.g., polycrystalline silicon), glass, quartz, etc. The inner frame 202 and outer frame 204 can be formed of any electrically conductive structure or electrode (e.g., made of polycrystalline silicon), which can be interspersed with or otherwise positioned in a capacitor-forming relationship with other electrically-conductive structures (e.g., electrodes 220, 222, 224) to produce a capacitive-sensing MEMS device of the type described herein.

The inner frame 202 is movably coupled to the substrate 201 through the translatory spring elements 206 and 208. The outer frame 204 is rotatively coupled to the inner frame 202 through rotative spring elements 210. The rotative coupling facilitates rotation of the outer frame 204 about a rotational axis that in this case corresponds to the x-axis. The translatory spring elements 206 and 208 facilitate translatory motion of the inner frame 202 and the outer frame 204 in an x-direction and a y-direction. In this embodiment the x-direction and a y-direction are parallel to the front surface of the substrate 201, but in other embodiments the translatory motions can be other directions relative to the substrate 201.

It should be noted that while the rotative spring elements 210 allow the outer frame 204 to rotate around the x-axis, the rotative spring elements do not allow significant lateral movement of the outer frame 204 relative to the inner frame 202. Thus, the outer frame 204 and the inner frame 202 will move laterally together relative to the substrate 201, with that lateral motion facilitated by the translatory spring elements 206 and 208. As will be described in greater detail below, this lateral motion of the inner frame 202 and outer frame 204 together, is used to detect acceleration in the corresponding directions (e.g., acceleration in the x-direction and y-direction).

The outer frame 204 has an asymmetric mass relative to the rotation axis. The asymmetric arrangement of the outer frame 204 provides sense mass that is used to detect acceleration in the third direction. Specifically, acceleration in the z-direction will cause a rotation of the outer frame 204 due the presence of the asymmetric mass. This rotation of the outer frame 204 about the x-axis caused by asymmetric mass is used to detect acceleration in the z-direction.

It should be noted that in this arrangement the asymmetric mass of the outer frame 204 is used in sensing acceleration in the z-direction, while the combined masses of both the outer frame 204 and the inner frame 202 are used in sensing acceleration in the x-direction and y-direction. Stated another way, only the mass of the inner frame 202 is not used for sensing in all three directions. Because the mass of the inner frame 202 can be made relatively small compared to the overall mass of the MEMS device 200, the percentage of the mass that is not used for sensing in all three directions can be relatively small, while providing relatively high sensitivity in all three directions.

Inner frame 202 provides a mechanically rigid structure that is used to suspend the outer frame 204 and rotative spring elements 210 relative to the substrate 201. In a typical embodiment, the inner frame 202 can be implemented with only enough material (e.g., silicon) to be mechanically stable when subjected to expected acceleration loads. Thus, the inner frame 202 can have relatively low mass while having sufficient mechanical stability to not substantially bend or be deformed. Thus, any material that does not contribute to significantly increase the stiffness and stability of the inner frame 202 can be excluded from inner frame 202 and, instead included on the outer frame 204 where it can be used for sensing in all three directions. Stated another way, having a relatively large mass in the outer frame 204 can keep the mass in the inner frame 202 relatively small, and because the mass in the inner frame 202 is not used for sensing in the z-direction the percentage of the overall mass not used for sensing in the z-direction is reduced. This reduction in the percentage of overall mass not used for sensing in the z-direction can reduce the overall mass of the device, and thus can reduce overall size and can improve the mechanical stability.

To facilitate accurate acceleration determination with this arrangement of the inner frame 202 and outer frame 204, the translatory spring elements 206 and 208 are configured to have asymmetric spring stiffness in response to forces in at least one direction. In general, the asymmetric spring stiffness of the translatory spring elements 206 and 208 are configured to compensate for the asymmetric mass of the outer frame 204. Thus, the asymmetric spring stiffness is used to facilitate correct lateral motion of the inner frame 202 and outer frame 204 in response to accelerations in the x and/or y-directions, and thus to facilitate accurate determinations of accelerations in those directions.

In a typical embodiment, the first stiffness of each first translatory spring element 206 is greater than the second stiffness of the corresponding second translatory spring element 208. Specifically, as stated above, the first translatory spring elements 206 and the second translatory spring 208 elements facilitate translatory motion in both the x-direction and the y-direction. Furthermore, the outer frame 204 has a mass that is asymmetric with respect to the x-axis. To compensate for this asymmetric mass of the outer frame 204 the first translatory spring elements 206 are implemented to have a greater stiffness in the x-direction compared to the x-direction stiffness of the second translatory spring elements 208. In one embodiment, a first stiffness of the first translatory spring element 206 (e.g., an x-direction stiffness of the first translatory spring element 206) is between about 10% and 40% greater than a second stiffness of the second translatory spring element 208 (e.g., the x-direction stiffness of the second translatory spring element 208). More specifically, the amount of x-direction stiffness difference provided will be based on the amount of mass asymmetry of the outer frame 204. Thus, the greater the mass asymmetry relative to the x-axis the greater the x-direction stiffness difference that should be provided to compensate for moments created by that mass asymmetry.

In the embodiment illustrated in FIGS. 2A and 2B, the outer frame 204 is substantially symmetric with respect to the y-axis. As such, the first translatory spring elements 106 can have a stiffness in the y-direction that is substantially equal to the y-direction stiffness of the second translatory spring elements 108. Thus, in this embodiment the translatory spring elements 206 and 208 have significant stiffness differences in one direction (i.e., the x-direction) but have substantially equal stiffness in another, orthogonal direction (i.e., the y-direction). It should be noted that this is just one example, and that other embodiments the spring elements 206 and 208 can have different stiffness in both the x-direction and the y-direction.

In either case the stiffness of a spring element in a particular direction (e.g., stiffness in the x-direction, stiffness in the y-direction) corresponds to the resistance to deformation of that spring element that occurs in response to a force in that particular direction (e.g., force in the x-direction, force in the y-direction). Stated another way, the stiffness of spring element in each of the directions can be described quantitatively using a spring constant for each direction, where the spring constant for each direction can be expressed in the units of Newtons per meter (N/m).

The translatory spring elements 206 and 208 can be implemented with a variety of different types of spring elements. As one example, the translatory spring elements 206 and 208 can be implemented with bending beams formed as part of the MEMS structure. In a typical implementation, the bending beams have a number of flexible beams that provide for motion in one direction (e.g., the x-direction) and flexible beams that provide motion in the other direction (e.g., the y-direction). In such an embodiment the stiffness of a bending beam can be determined by length, thickness, and/or number of bends in the in these flexible beams. Thus, to make a bending beam have greater stiffness in one direction compared to another bending beam the length, thickness, and/or number of bends in the in these flexible beams can be configured to provide such relative stiffness.

In the example of FIGS. 2A and 2B, the first translatory spring elements 206 can be made with less turns in the components of the spring that provide movement in x-direction compared to the corresponding number of bends in the second translatory spring elements 208. A specific example of such an implementation will be discussed below with reference to FIG. 6.

The rotative spring elements 210 can likewise be implemented as part of the MEMS structure. As one example, the rotative spring elements 210 can be implemented with bending beams configured to form torsion spring elements. These torsion spring elements implemented with bending beams can be fabricated using a variety of MEMS fabrication techniques.

The rigid stops 225 are configured to restrain the inner frame 202. The rigid stops are implemented to prevent the inner frame from moving enough to impact and potentially damage the electrodes 220 and 222. The flexible stops 226 are configured to restrain the translatory motion of the outer frame 204. In one embodiment, the flexible stops 226 are made flexible by the addition of one or more additional flexible beams. These flexible beams can be placed between the movable part (e.g., the outer frame 204) and an element anchored to the substrate 201, such that the flexible beams can deform and absorb shock when the movable part moves to contact the flexible stop 226. In contrast, rigid stops 225 can be implemented to directly contact an anchored element without an intervening flexible beam.

The use of flexible stops can improve the mechanical reliability of the device 200 by reducing the effects of high impact loads on the device 200. Specifically, the impact load that acts on a travel stop in case of contact depends in part on the mass that hits the stop and the contact stiffness of the stop. Thus, a flexible stop with less contact stiffness will have a reduced impact load compared to a rigid stop. However, the nature of a flexible stop results in additional travel compared to a rigid stop. In the case of a MEMS device, that additional travel could allow contact between the movable frames and the fixed electrodes, resulting in potential damage to the fixed electrodes.

In the MEMS device 200, the use of the flexible stops 226 is facilitated by the use of the outer frame 204 being rotatively coupled to the inner frame 202, and the inner frame 202 being coupled with translatory spring elements to the substrate. Specifically, in the MEMS device 200, the combination of rigid stops 225 used to restrain the inner frame 202 and the use of flexible stops 226 to restrain the outer frame 204 can provide significant advantage. The rigid stops 225 restrain the inner frame 202 and thus provide protection for the relatively fragile electrodes 220 and 222. The flexible stops 226 restrain the outer frame 204 and thus provide reduced impact loads for the relatively massive outer frame 204. The use of the flexible stops 226 for the outer frame 204 is made possible because the outer frame 204 is decoupled from the inner frame 202 by the rotative spring elements 210 and because the outer frame 204 cannot contact the electrodes 220 and 222 directly.

Specifically, during normal operation the rotative spring elements 210 cause the inner frame 202 and outer frame 204 to move together in the x and y-directions when subjected to translatory accelerations in those directions. However, during a very high impact event (e.g., a factor of 10 or more above normal accelerations), the rotative spring elements 210 can bend and allow relatively small amounts of translatory motion between the inner frame 202 and outer frame 204. Thus, during a high impact event in the x or y-direction the inner frame 202 and outer frame 204 will first move together in those directions. However, when the inner frame 202 contacts the rigid stops 225, the inner frame 202 will stop, while the rotative spring elements 210 and the flexible stops 226 will allow the outer frame 204 to continue to move a small amount. This abrupt stopping of the inner frame 202 will protect the electrodes 220 and 222 from damage that would be caused by an impact with the inner frame 202. Furthermore, because the inner frame 202 can have a relatively low mass by itself, the impact load of this abrupt stop on the overall MEMS device 200 is relatively low.

Furthermore, the continued movement of the outer frame 204 facilitated by the rotative spring elements 210 and the flexible stops 226 will allow the impact load of the relatively large mass outer frame 204 to be mitigated by the flexible stops 226. Thus, the additional movement provided by the rotative spring elements 210 and the flexible stops 226 will significantly reduce the effects of the impact load on the MEMS device 200 caused by the high impact event and the relatively high mass of the outer frame 204.

The first electrodes 220, second electrodes 222, and third electrodes 224 are used to facilitate measuring of accelerations in the x, y and z directions respectively. Specifically, the electrodes 220 are configured in capacitor-forming relationships with the inner frame 202, such that translatory motion of the inner frame 202 in the x-direction changes the distances between the inner frame 202 and the electrodes 220. These changes in distance result in changes in capacitance. Because acceleration in the x-direction causes changes in the distances these changes in capacitance can be measured and used to determine acceleration in the x-direction. Likewise, the electrodes 222 are configured in capacitor-forming relationships with the inner frame 202, such that acceleration in the y-direction changes the distances between the inner frame 202 and the electrodes 220. Finally, the electrodes 224 are configured in capacitor-forming relationships with the outer frame 204. Because acceleration in the z-direction causes rotation (and changes in distances), these changes in capacitance can be measured and used to determine acceleration in the z-direction.

In the illustrated embodiment, the electrodes 220, 222 and 224 are arranged to facilitate differential measurements of capacitance. Specifically, the electrodes 220, 222 and 224 are arranged in pairs such that acceleration in a direction will cause one capacitance in the pair to increase and the other capacitance in the pair to decrease. A subtraction or differential measurement of the two capacitances provides a measure of the acceleration causing the changes in capacitances. This measurement based on the differential of two separate capacitances can result in a higher resolution and greater immunity to noise.

It should be understood that the MEMS device 200 may also include one more traces, interconnect lines, conductive vias, etc., for making electrical connections to the inner frame 202, outer frame 204, and electrodes 220, 222 and 224. It should also be understood that other processes, such as "CMOS MEMS" used to fabricated transistors and other semiconductor devices, may also be used. These techniques facilitate applying appropriate voltages to the components for measuring and/or monitoring the various capacitances. The changes in capacitances can be converted via electronics (e.g., a processor, a memory device, etc. which may be formed on the same substrate as the inner frame 202 and outer frame 204) into a signal having a parameter magnitude (e.g. voltage, current, frequency, etc.) that is dependent on acceleration of MEMS device 200.

Figure 3A:
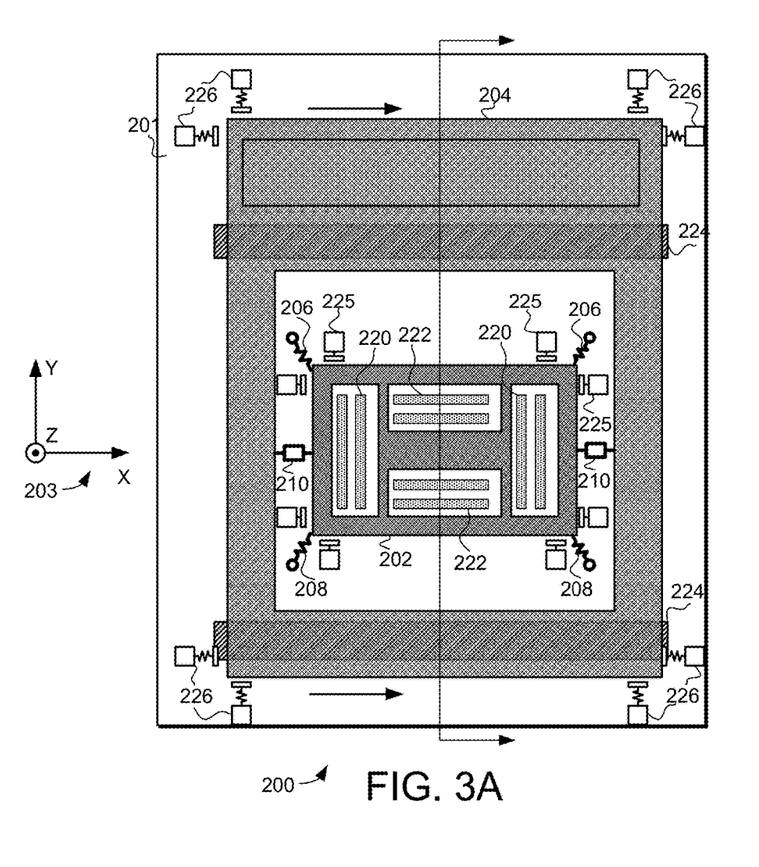
FIGS. 3A-3B are top and cross-sectional side views of a MEMS device in accordance with example embodiments.
Figure 3B:
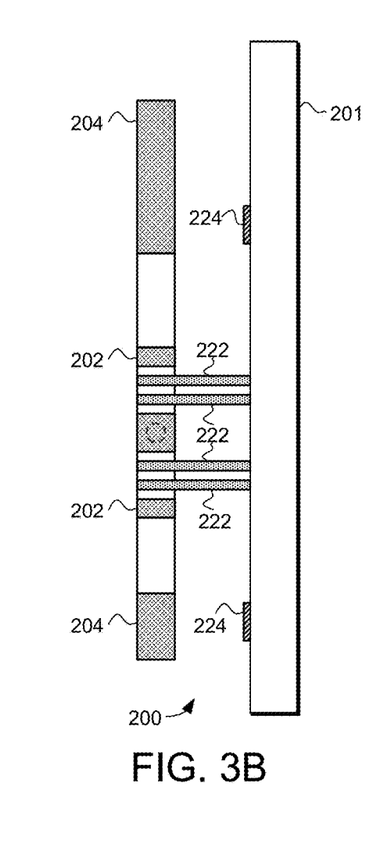

Turning now to FIGS. 3A and 3B, a second top view and second cross-sectional view of the MEMS device 200 is illustrated. In this illustrated view, acceleration or other source of force is being applied in the x-direction. This acceleration causes the inner frame 202 and outer frame 204 to have lateral translatory motion in the x-direction. As discussed above with regard to FIG. 2A, this translatory motion in the x-direction is facilitated by the translatory spring elements 206 and 208. Furthermore, because the inner frame 202 and outer frame 204 are coupled with rotative spring elements 210, the inner frame 202 and outer frame 204 will move with translatory motion together.

It should be noted that because the outer frame has an asymmetric mass with respect to the x-axis that the acceleration in the x-direction will cause rotational moments on the outer frame 204 to be created. However, because the translatory spring elements 206 and 208 have asymmetric stiffness in the x-direction, these moments created by the asymmetry will be compensated for. This facilitates the correct translatory motion in the x-direction in response to the acceleration in the x-direction.

The translatory motion of the inner frame 202 and the outer frame 204 in the x-direction cause changes in the distances between the inner frame 202 and the first electrodes 220. It should also be noted that in this example the motion of the inner frame 202 and the outer frame 204 caused by acceleration in the x-direction results in substantially perpendicular relative to the length of the first electrodes 220. Such an arrangement can provide high device sensitivity for measurements of acceleration in the x-direction, as the capacitance changes are greatest with motion that causes perpendicular motion with little or no twisting or rotation. Thus, the changes in the distances cause a relatively large change in capacitances, and the measurements of the capacitances can be used to determine a measure of the acceleration or other force being applied in the x-direction to the MEMS device 200.

Figure 4A:
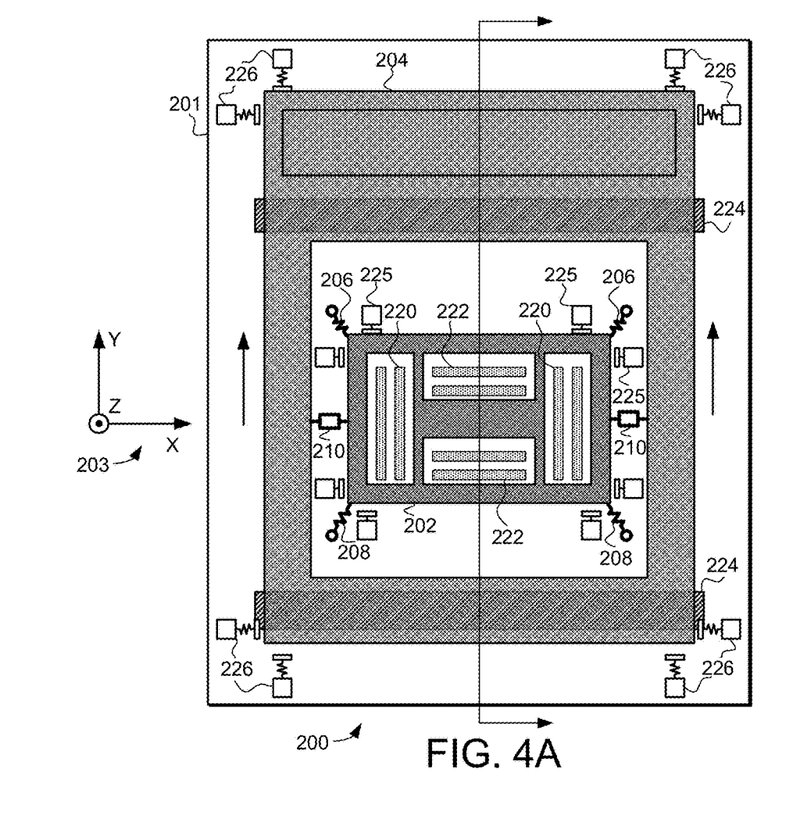
FIGS. 4A-4B are top and cross-sectional side views of a MEMS device in accordance with example embodiments.
Figure 4B:
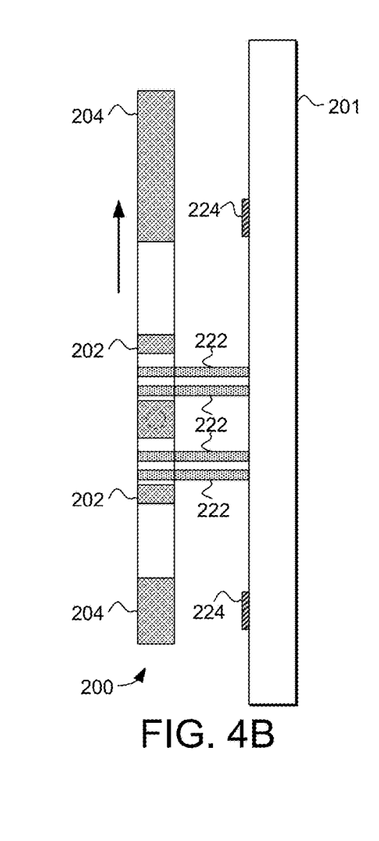

Turning now to FIGS. 4A and 4B, a third top view and third cross-sectional view of the MEMS device 200 is illustrated. In this illustrated view, acceleration or other source of force is being applied in the y-direction. This acceleration causes the inner frame 202 and outer frame 204 to have lateral translatory motion in the y-direction. This translatory motion in the y-direction is again facilitated by the translatory spring elements 206 and 208. Furthermore, because the inner frame 202 and outer frame 204 are coupled with rotative spring elements 210, the inner frame 202 and outer frame 204 will again move with translatory motion together.

It should be noted that in this embodiment the outer frame 204 is substantially symmetric with respect to the y-axis. Thus, acceleration in the y-direction will not cause significant twisting moments. For this reason the translatory spring elements 206 and 208 can have substantially symmetric stiffness in the y-direction, and accelerations in the y-direction will still cause the correct translatory motion in the y-direction.

The translatory motion of the inner frame 204 and the outer frame 204 in the y-direction cause changes in the distances between the inner frame 202 and the second electrodes 222. Again, it should also be noted that in this example the motion of the inner frame 202 and the outer frame 204 caused by acceleration in the y-direction results in substantially perpendicular relative to the length of the second electrodes 222. Such an arrangement can provide high device sensitivity as the capacitance changes are greatest with motion that causes perpendicular motion with little or no twisting or rotation.

Figure 5A:
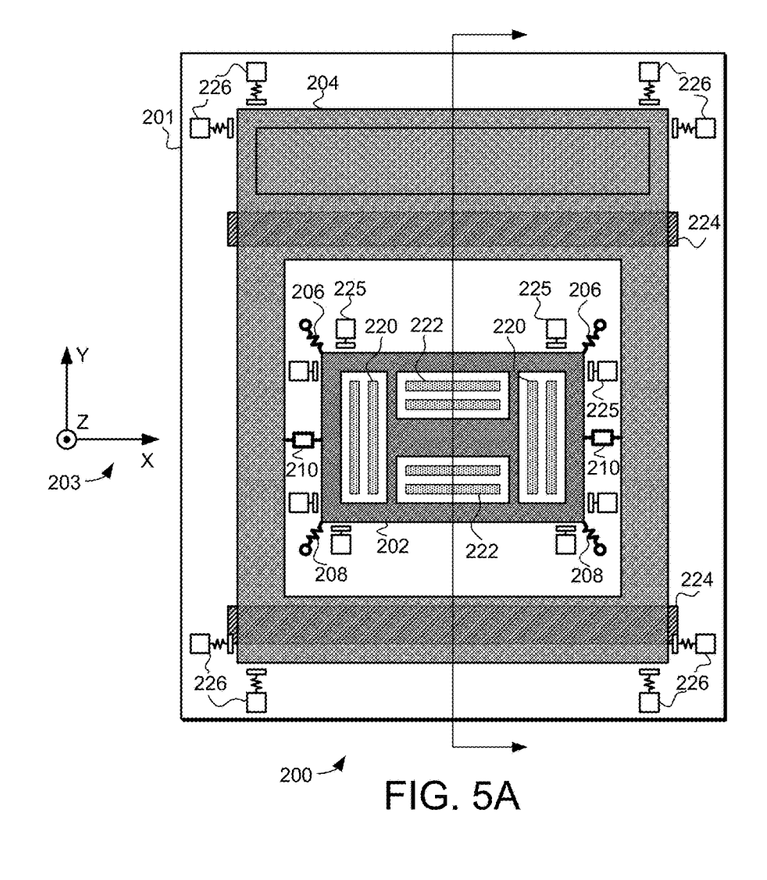
FIGS. 5A-5B are top and cross-sectional side views of a MEMS device in accordance with example embodiments.
Figure 5B:
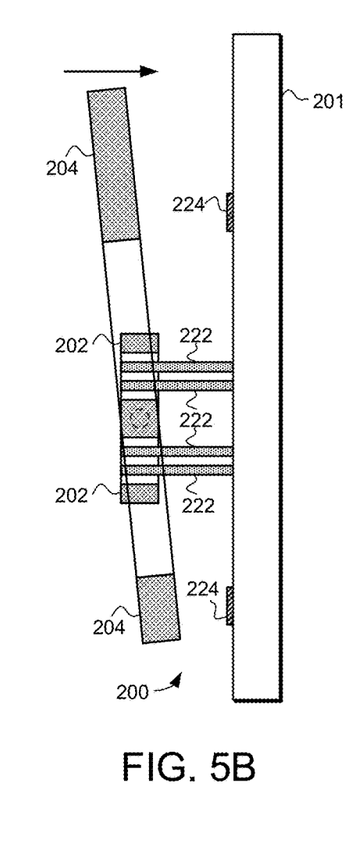

Turning now to FIGS. 5A and 5B, a fourth top view and fourth cross-sectional view of the MEMS device 200 is illustrated. In this illustrated view, acceleration or other source of force is being applied in the z-direction. Because the outer frame 204 has asymmetric mass with respect to the x-axis this acceleration causes the outer frame 204 to rotate about the x-axis. This rotative motion about the x-axis is facilitated by the rotative spring elements 210. Furthermore, because the inner frame 202 and outer frame 204 are rotatively coupled with rotative spring elements 210, the outer frame 204 can rotate while the rotation of the inner frame 202 is suppressed by the translatory springs 206 and 208.

And as shown in FIG. 5B, this rotative motion of the outer frame 204 causes changes in the distances between the outer frame 204 and the third electrodes 224. These changes in the distances cause a change in capacitances, and thus measurements of the capacitances can be used to determine a measure of the acceleration or other force being applied in the z-direction to the MEMS device 200.

As was described above, the MEMS device 200 can sense acceleration in three directions. In the preceding discussion, those three directions were described with reference to the coordinate labels 203 (i.e., x-direction, y-direction, z-direction defined by three orthogonal axes (i.e., x-axis, y-axis, and z-axis)). It should be noted that the labeling of such directions and axes is arbitrary, and that other definitions and coordinate labeling systems could be used to describe the operation of such MEMS devices. It should be further noted that while these figures show an exemplary orientation of the MEMS device 200 relative to the three exemplary defined directions and axes, that again this is just one example implementation.

The embodiments illustrated in FIGS. 2-5 provide reliability and sensitivity by decoupling sensing along one axis (e.g., the z-axis) from the sensing along the other two axes (e.g., the x-axis and the y-axis). This decoupling is facilitated by the use translatory spring elements 206 and 208 that with asymmetric stiffness in the x-direction that compensates for the asymmetric mass of the outer frame 204 used to sense in the z-direction.

Figure 6:
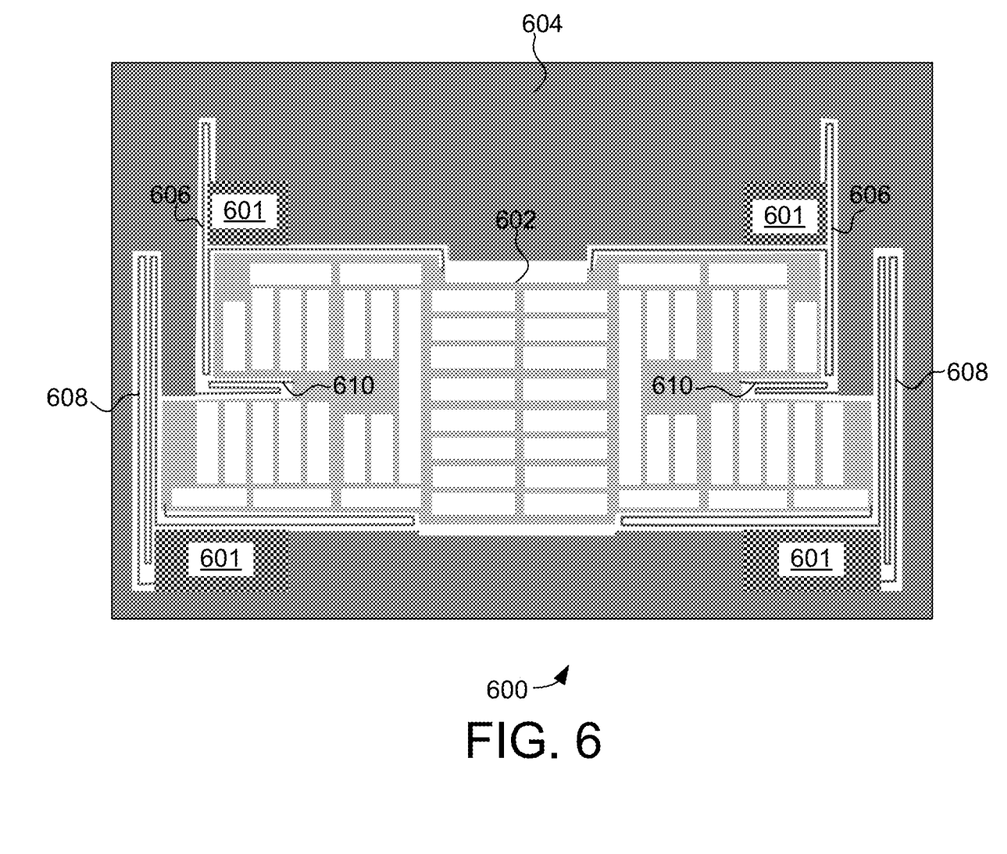
FIG. 6 is a top view of a MEMS device in accordance with example embodiments.

Turning now to FIG. 6, a top view of a MEMS device 600 is illustrated. This view shows the MEMS device 600 as fabricated with an appropriate semiconductor substrate. In this embodiment, the MEMS device 600 includes an inner frame 602, an outer frame 604 (illustrated in darker grey), first translatory spring elements 606, second translatory spring elements 608, and rotative spring elements 610. The electrodes inside the inner frame 602 are not shown for simplicity. Again, the MEMS device 600 is configured to determine force applied by acceleration in any of three orthogonal directions.

The inner frame 602 is movably coupled to substrate anchors 601 through the translatory spring elements 606 and 608. The outer frame 604 is coupled to the inner frame 602 through rotative spring elements 610. The rotative coupling provided by the rotative spring elements 610 facilitates rotation of the outer frame 604 about a rotational axis. The translatory spring elements 606 and 608 facilitate translatory motion of the inner frame 602 and the outer frame 604. In this case the inner frame 602, outer frame 604, first translatory spring elements 606, second translatory spring elements 608, and rotative spring elements 610 are all formed in the same layer and of the same material in the MEMS device 600. Specifically, these elements can be formed in a layer of silicon or other suitable materials.

In this illustrated embodiment, the translatory spring elements 606 and 608 and the rotative spring elements 610 are each bending beam spring elements. The translatory spring elements 606 and 608 have flexible beams that provide for motion. Specifically, each translatory spring element 606 and 608 has flexible beams arranged with their major axis length arranged in x-axis and flexible beams arranged with their major axis length in the y-axis. Thus, each translatory spring element 606 and 608 can facilitate motion in both the x-direction and the y-direction.

In such bending beam spring elements, the stiffness in a direction is determined at least in part by the number of bends and number of beam elements that correspond to a particular direction. Specifically, a fewer number of beam elements and bends corresponds to greater stiffness in the corresponding direction. In this illustrated embodiment, the first translatory spring elements 606 have a fewer number of beam elements and bends for one direction than the second translatory spring elements 608 has for that same direction. The result is that the first translatory spring elements 606 have a greater stiffness in that one direction compared to the second translatory spring elements 608.

The asymmetric spring stiffness of the translatory spring elements 606 and 608 provided by these different number of beam elements is configured to compensate for the asymmetric mass of the outer frame 604. Thus, the asymmetric spring stiffness is used to facilitate correct lateral motion of the inner frame 602 and outer frame 604 in response to accelerations in the x and/or y-directions, and thus to facilitate accurate determinations of accelerations in those directions.

In one embodiment a MEMS device is provided, comprising: a substrate; an inner frame movably coupled to the substrate through at least a first translatory spring element and a second translatory spring element, the first translatory spring element and the second translatory spring element facilitating translatory motion of the inner frame relative to the substrate, an outer frame rotatively coupled to the inner frame to facilitate rotation of the outer frame about a rotational axis, wherein the outer frame comprises a mass that is asymmetric relative to the rotation axis, the first translatory spring element has a first stiffness, the second translatory spring element has a second stiffness, and the first stiffness is greater than the second stiffness to compensate for moments created by the asymmetric mass of the outer frame in response to translatory acceleration relative to the substrate along a first direction defined by a first axis.

In another embodiment, a MEMS accelerometer device is provided, the device comprising: a substrate; an inner frame movably coupled to the substrate through a first translatory spring element, a second translatory spring element, a third translatory spring element, and a fourth translatory spring element, the first, the second, the third, and the fourth translatory spring elements configured to facilitate translatory motion of the inner frame in both an x-direction defined by an x-axis and a y-direction defined by a y-axis, where the x-axis and the y-axis are both relative to the substrate; and an outer frame rotatively coupled to the inner frame with a torsion spring element to facilitate rotation of the outer frame about the x-axis, the outer frame having an asymmetric mass relative to the x-axis; and wherein the first translatory spring element has a first x-direction stiffness and a first y-direction stiffness, and wherein the second translatory spring element has a second x-direction stiffness and a second y-direction stiffness, and wherein the third translatory spring element has a third x-direction stiffness and a third y-direction stiffness, and wherein the fourth translatory spring element has a fourth x-direction stiffness and a fourth y-direction stiffness, and wherein the first x-direction stiffness is substantially greater than the second x-direction stiffness and the third x-direction stiffness is substantially greater than the fourth x-direction stiffness to compensate for moments created by the asymmetric mass of the outer frame.

In another embodiment, a three-axis MEMS accelerometer device is provided. The three-axis MEMS accelerometer device is configured to determine a measure of acceleration in an x-direction, a y-direction, and a z-direction, where the x-direction, y-direction and z-direction are orthogonal directions defined by an x-axis, y-axis, and z-axis respectively, the three-axis MEMS accelerometer device comprising: a substrate; an inner frame movably coupled to the substrate through a first translatory spring element, a second translatory spring element, a third translatory spring element, and a fourth translatory spring element, the first, the second, the third, and the fourth translatory spring elements configured to facilitate translatory motion of the inner frame in both the x-direction and the y-direction, and wherein the first translatory spring element has a first x-direction stiffness and a first y-direction stiffness, and wherein the second translatory spring element has a second x-direction stiffness and a second y-direction stiffness, and wherein the third translatory spring element has a third x-direction stiffness and a third y-direction stiffness, and wherein the fourth translatory spring element has a fourth x-direction stiffness and a fourth y-direction stiffness; a first electrode pair and a second electrode pair coupled to the substrate, wherein the first electrode pair is configured in a first differential capacitor-forming relationship with the inner frame that changes capacitance in response to displacement along the x-direction, and wherein the second electrode pair is in a second differential capacitor-forming relationship with the inner frame that changes capacitance in response to displacement along the y-direction; an outer frame rotatively coupled to the inner frame with a torsion spring element to facilitate rotation of the outer frame about the x-axis, the outer frame having a mass that is asymmetric relative to the x-axis; and a third electrode pair coupled to the substrate, wherein the outer frame is in a third differential capacitor-forming relationship with the third electrode pair that changes capacitance in response to rotation of the outer frame about the x-axis; and wherein the first x-direction stiffness is substantially greater than the second x-direction stiffness and the third x-direction stiffness is substantially greater than the fourth x-direction stiffness to compensate for moments created by the asymmetric mass of the outer frame.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

For the sake of brevity, conventional techniques related to microelectromechanical systems (MEMS) fabrication and development, MEMS sensing, electrical connections, analog circuit design, and other functional aspects of the systems (and the individual operating components of the systems) may not be described in detail herein. It should be understood that any circuitry described herein may be implemented either in silicon or another semiconductor material or alternatively by software code representation thereof.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A microelectromechanical systems (MEMS) device comprising:
    a substrate;
    an inner frame movably coupled to the substrate through at least a first translatory spring element, a second translatory spring element, a third translatory spring element, and a fourth translatory spring element, wherein the first translatory spring element, the second translatory spring element, the third translatory spring element, and the fourth translatory spring element are configured to facilitate translatory motion of the inner frame in a first direction defined by a first axis relative to the substrate; and
    an outer frame rotatively coupled to the inner frame to facilitate rotation of the outer frame about a rotational axis, wherein
        the outer frame comprises a mass that is asymmetric relative to the rotation axis;
        the first translatory spring element has a first stiffness in the first axis;
        the second translatory spring element has a second stiffness in the first axis;
        the third translatory spring element has a third stiffness in the first axis;
        the fourth translatory spring element has a fourth stiffness in the first axis; and
        the first stiffness in the first axis is greater than the second stiffness in the first axis and the third stiffness in the first axis is greater than the fourth stiffness in the first axis to compensate for moments created by the asymmetric mass of the outer frame in response to translatory acceleration relative to the substrate along the first direction defined by the first axis.

2. The MEMS device of claim 1, wherein the first direction defined by the first axis comprises a x-direction defined by a x-axis, and wherein the translatory motion of the inner frame relative to the substrate is in the x-direction and a y-direction, and wherein the rotation of the outer frame about a rotational axis comprises rotation about the x-axis, and wherein the first stiffness, second stiffness, third stiffness, and fourth stiffness comprise stiffness in the x-axis.

3. The MEMS device of claim 2, further comprising a first electrode and second electrode coupled to the substrate, and wherein the inner frame is in a first capacitor-forming relationship with the first electrode to detect displacement along the x-direction, and wherein the inner frame is in a second capacitor-forming relationship with the second electrode to detect displacement along a y-direction.

4. The MEMS device of claim 3, further comprising a third electrode coupled to the substrate, and wherein the outer frame is in a third capacitor-forming relationship with the third electrode to detect rotation of the outer frame about the x-axis.

5. The MEMS device of claim 1, wherein
    the first direction defined by the first axis comprises a x-direction defined by a x-axis,
    the first stiffness comprises a first x-direction stiffness and a first y-direction stiffness,
    the second stiffness comprises a second x-direction stiffness and a second y-direction stiffness,
    the third stiffness comprises a third x-direction stiffness and a third y-direction stiffness,
    the fourth stiffness comprises a fourth x-direction stiffness and a fourth y-direction stiffness,
    the first y-direction stiffness is substantially equal to the second y-direction stiffness,
    the third y-direction stiffness is substantially equal to the fourth y-direction stiffness, and
    the first stiffness in the first axis is greater than the second stiffness in the first axis and the third stiffness in the first axis is greater than the fourth stiffness in the first axis to compensate for the moments created by the asymmetric mass of the outer frame by virtue of the first x-direction stiffness being substantially greater than the second x-direction stiffness and the third x-direction stiffness being substantially greater than the fourth x-direction stiffness.

6. The MEMS device of claim 1, wherein the first translatory spring element comprises first bending beams and wherein the second translatory spring element comprises second bending beams.

7. The MEMS device of claim 1, wherein the first stiffness is between 10% and 40% greater than the second stiffness.

8. The MEMS device of claim 1, wherein the outer frame is rotatively coupled to the inner frame with a torsion spring element.

9. The MEMS device of claim 1, wherein the outer frame has a first mass, and wherein the inner frame has a second mass, and wherein the first mass is at least twice the second mass.

10. The MEMS device of claim 1, wherein the first direction defined by the first axis comprises a x-direction defined by a x-axis; and
    the inner frame comprises electrodes configured to facilitate detection of acceleration along the x-direction and a y-direction; and
    the outer frame comprises electrodes configured to facilitate detection of the acceleration along a z-direction such that the detection of acceleration along the z-direction is decoupled from the detection of acceleration along the along the x-direction and the y-direction.

11. The MEMS device of claim 1, further comprising a plurality of flexible stops configured to restrain motion the outer frame.

12. The MEMS device of claim 1, wherein the first translatory spring element and the second translatory spring element each comprises a bending beam coplanar with the inner frame.

13. A microelectromechanical systems (MEMS) accelerometer device comprising:
    a substrate;
    an inner frame movably coupled to the substrate through a first translatory spring element, a second translatory spring element, a third translatory spring element, and a fourth translatory spring element, the first, the second, the third, and the fourth translatory spring elements configured to facilitate translatory motion of the inner frame in both an x-direction defined by an x-axis and a y-direction defined by a y-axis, where the x-axis and the y-axis are orthogonal and both relative to the substrate; and
    an outer frame rotatively coupled to the inner frame with a torsion spring element to facilitate rotation of the outer frame about the x-axis, the outer frame having an asymmetric mass relative to the x-axis; and
    wherein the first translatory spring element has a first x-direction stiffness and a first y-direction stiffness, and wherein the second translatory spring element has a second x-direction stiffness and a second y-direction stiffness, and wherein the third translatory spring element has a third x-direction stiffness and a third y-direction stiffness, and wherein the fourth translatory spring element has a fourth x-direction stiffness and a fourth y-direction stiffness, and wherein the first x-direction stiffness is substantially greater than the second x-direction stiffness and the third x-direction stiffness is substantially greater than the fourth x-direction stiffness to compensate for moments created by the asymmetric mass of the outer frame.

14. The MEMS accelerometer device of claim 13, wherein the first translatory spring element, second translatory spring element, third translatory spring element, and fourth translatory spring element each comprise a bending beam substantially coplanar with the inner frame.

15. The MEMS accelerometer device of claim 13, wherein the first translatory spring element is positioned closer to the asymmetric mass compared to the second translatory spring element, and wherein the third translatory spring element is positioned closer to the asymmetric mass compared to the fourth translatory spring element.

16. The MEMS accelerometer device of claim 13, further comprising a first electrode pair, a second electrode pair, and a third electrode pair coupled to the substrate, and wherein the inner frame is in a first differential capacitor-forming relationship with the first electrode pair to detect displacement along the x-direction, and wherein the inner frame is in a second differential capacitor-forming relationship with the second electrode pair to detect displacement along a y-direction, and wherein the outer frame is in third differential capacitor-forming relationship with the third electrode pair to detect rotation of the outer frame about the x-axis.

17. The MEMS accelerometer device of claim 13, wherein the first x-direction stiffness is between 10% and 40% greater than the second x-direction stiffness.

18. The MEMS accelerometer device of claim 13, wherein the outer frame has a first mass, and wherein the inner frame has a second mass, and wherein the first mass is at least 10 times the second mass.

19. The MEMS accelerometer device of claim 13, further comprising a plurality of flexible stops configured to restrain motion the outer frame.

20. A three-axis microelectromechanical systems (MEMS) accelerometer device configured to determine a measure of acceleration in an x-direction, a y-direction, and a z-direction, where the x-direction, y-direction and z-direction are orthogonal directions defined by an x-axis, y-axis, and z-axis respectively, the three-axis MEMS accelerometer device comprising:
 a substrate;
 an inner frame movably coupled to the substrate through a first translatory spring element, a second translatory spring element, a third translatory spring element, and a fourth translatory spring element, the first, the second, the third, and the fourth translatory spring elements configured to facilitate translatory motion of the inner frame in both the x-direction and the y-direction, and wherein the first translatory spring element has a first x-direction stiffness and a first y-direction stiffness, and wherein the second translatory spring element has a second x-direction stiffness and a second y-direction stiffness, and wherein the third translatory spring element has a third x-direction stiffness and a third y-direction stiffness, and wherein the fourth translatory spring element has a fourth x-direction stiffness and a fourth y-direction stiffness;
 a first electrode pair and a second electrode pair coupled to the substrate, wherein the first electrode pair is configured in a first differential capacitor-forming relationship with the inner frame that changes capacitance in response to displacement along the x-direction, and wherein the second electrode pair is in a second differential capacitor-forming relationship with the inner frame that changes capacitance in response to displacement along the y-direction;
 an outer frame rotatively coupled to the inner frame with a torsion spring element to facilitate rotation of the outer frame about the x-axis, the outer frame having a mass that is asymmetric relative to the x-axis;
 a third electrode pair coupled to the substrate, wherein the outer frame is in a third differential capacitor-forming relationship with the third electrode pair that changes capacitance in response to rotation of the outer frame about the x-axis; and
 wherein the first x-direction stiffness is substantially greater than the second x-direction stiffness and the third x-direction stiffness is substantially greater than the fourth x-direction stiffness to compensate for moments created by the asymmetric mass of the outer frame.

* * * * *